US012777921B2

(12) United States Patent
Shrivastava et al.

(10) Patent No.: US 12,777,921 B2
(45) Date of Patent: Oct. 27, 2026

(54) MIM FLUX CAPACITOR WITH THIN AND THICK METAL LEVELS

(71) Applicant: TEXAS INSTRUMENTS INCORPORATED, Dallas, TX (US)

(72) Inventors: Kumar Anurag Shrivastava, Bangalore (IN); Viresh Chinchansure, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 611 days.

(21) Appl. No.: 18/128,490

(22) Filed: Mar. 30, 2023

(65) Prior Publication Data

US 2024/0194583 A1 Jun. 13, 2024

(51) Int. Cl.

| | |
|---|---|
| ***H01L 23/522*** | (2006.01) |
| ***H10D 1/68*** | (2025.01) |
| ***H10W 20/40*** | (2026.01) |

(52) U.S. Cl.
CPC .......... *H10W 20/496* (2026.01); *H10D 1/714* (2025.01); *H10D 1/716* (2025.01)

(58) Field of Classification Search
CPC ..... H01L 23/5223; H10D 1/714; H10D 1/716
See application file for complete search history.

(56) References Cited

U.S. PATENT DOCUMENTS

| | | | | |
|---|---|---|---|---|
| 2020/0043874 A1* | 2/2020 | Sira | G06F 30/367 |
| 2023/0187479 A1* | 6/2023 | Tu | H10D 1/714<br>257/532 |

* cited by examiner

*Primary Examiner* — John A Bodnar
(74) *Attorney, Agent, or Firm* — Andrew R. Ralston; Charles F. Koch

(57) ABSTRACT

An integrated circuit includes first second metal levels over a semiconductor substrate. A first capacitor electrode in the first metal level has a plurality of first lines. A second capacitor electrode in the first metal level includes a plurality of second lines alternating with the plurality of first metal lines. A third capacitor electrode in the second metal level includes a plurality of third lines. And a fourth capacitor electrode in the second metal level includes a plurality of fourth parallel lines alternating with the plurality of third metal lines. Each of the third lines is located over a first one of the first lines and a first one of the second lines, and each of the fourth lines is located over a second one of the first lines and a second one of the second lines.

24 Claims, 9 Drawing Sheets

MIM FLUX CAPACITOR WITH THIN AND THICK METAL LEVELS

FIELD

This disclosure relates to the field of semiconductor manufacturing, and more particularly, but not exclusively, to integrated metal-insulator-metal (MIM) flux capacitors.

BACKGROUND

Various integrated circuits include capacitors to provide a reactive impedance in various applications, such as radio-frequency circuits. It is generally desirable to limit the parasitic capacitance of such components.

SUMMARY

The inventors disclose various devices and methods related to integrated circuits that include a MIM capacitor with reduced parasitic capacitance.

In one example an integrated circuit includes first second metal levels over a semiconductor substrate. A first capacitor electrode in the first metal level has a plurality of first lines. A second capacitor electrode in the first metal level includes a plurality of second lines alternating with the plurality of first metal lines. A third capacitor electrode in the second metal level includes a plurality of third lines. And a fourth capacitor electrode in the second metal level includes a plurality of fourth parallel lines alternating with the plurality of third metal lines. Each of the third lines is located over a first one of the first lines and a first one of the second lines, and each of the fourth lines is located over a second one of the first lines and a second one of the second lines.

Other examples include methods of manufacturing integrated circuit devices according to the integrated circuit described above.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Various disclosed methods and devices of the present disclosure may be beneficially applied to integrated circuits by reducing parasitic capacitance between a capacitor and an underlying substrate. While such examples may be expected to improve performance of such circuits, e.g. by reducing parasitic coupling losses, no particular result is a requirement of the present invention unless explicitly recited in a particular claim.

Figure 1:
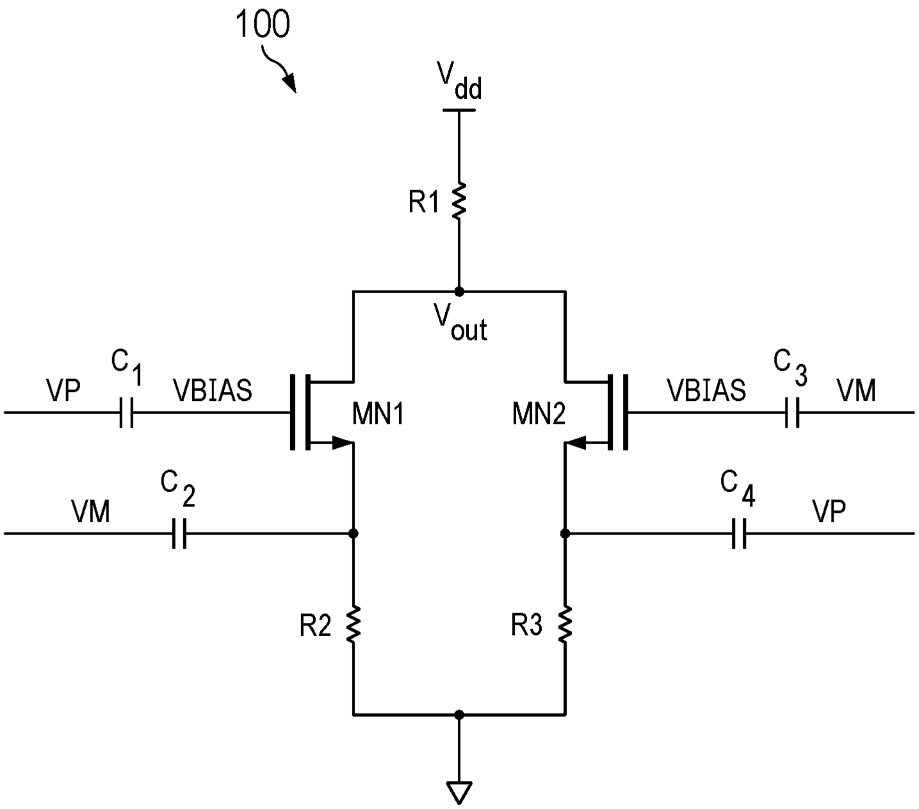
FIG. 1 illustrates an example circuit including a number of transistors, resistors and capacitors.

FIG. 1 illustrates an example circuit 100 that includes transistors, resistors and capacitors. The circuit 100 may be used, for example, to convert a received radio frequency signal to the electrical domain for processing. A resistor R1 is connected between a positive voltage rail VDD and a circuit node connected to a left-side leg and a right-side leg. The left-side leg includes an NMOS transistor MN1 in series with a resistor R2, and the right-side leg includes an NMOS transistor MN2 in series with a resistor R3. The transistors MN1 and MN2 may be matched, and the resistors R1 and R2 may be matched. A capacitor C1 couples a received signal VP to the gate of the MN1, and a capacitor C2 couples a complementary received signal VM to the node between the source of MN1 and R2. Similarly, a capacitor C3 couples VM to the gate of MN2, and a capacitor C4 couples VP to the node between the source of MN2 and R3. A bias signal $V_{bias}$ coupled to the gates of MN1 and MN2 may bias the input signals as desired. The resulting transduced electrical signal Vout is produced at the node between R1, MN1 and MN2. In some examples, the circuit 100 may be configured to operate at a center frequency of about 2 GHZ, and the capacitors C1 . . . C4 may be about 150 fF.

Figure 2:
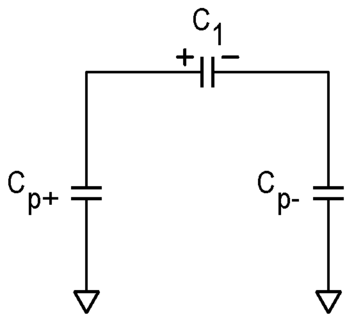
FIG. 2 illustrates parasitic components of one of the capacitors of FIG. 1.

FIG. 2 illustrates the capacitor C1 in greater detail. The capacitor may be viewed as having two plates, or electrodes, separated by a capacitor dielectric. For convenience of discussion one plate is designated as positive, or"+", and the other plate is designated negative, or "–". The capacitor has a "primary capacitance", or the capacitance that is attributable to the direct capacitance between the plates. Each of the plates may experience a parasitic capacitance to a voltage reference node, e.g. ground. Thus a circuit node connected to the positive plate is also capacitively coupled to ground via a parasitic capacitance $C_{p+}$ and another circuit node connected to the negative plate is capacitively coupled to ground via a parasitic capacitance $C_{p-}$. This principle may also be applied to each of the capacitors C2, C3 and C4. The presence of the parasitic capacitances generally degrades the performance of the circuit 100 with respect to nominal design performance.

Figure 3A:
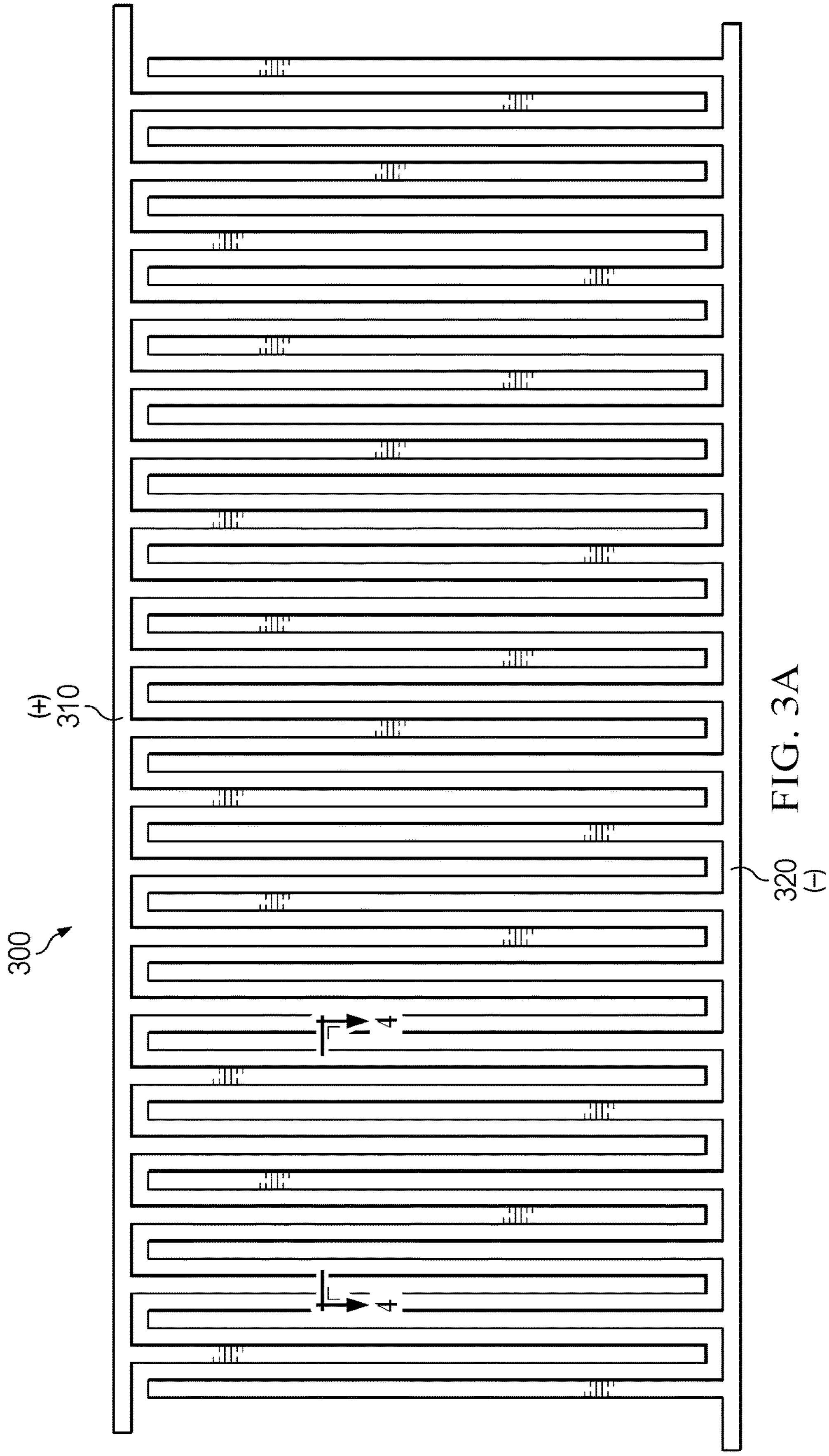
FIGS. 3A and 3B respectively illustrate first and second capacitor electrodes in a MET1 level, and third and fourth capacitor electrodes in a MET2 level, as may be used in a baseline MIM capacitor.
Figure 3B:
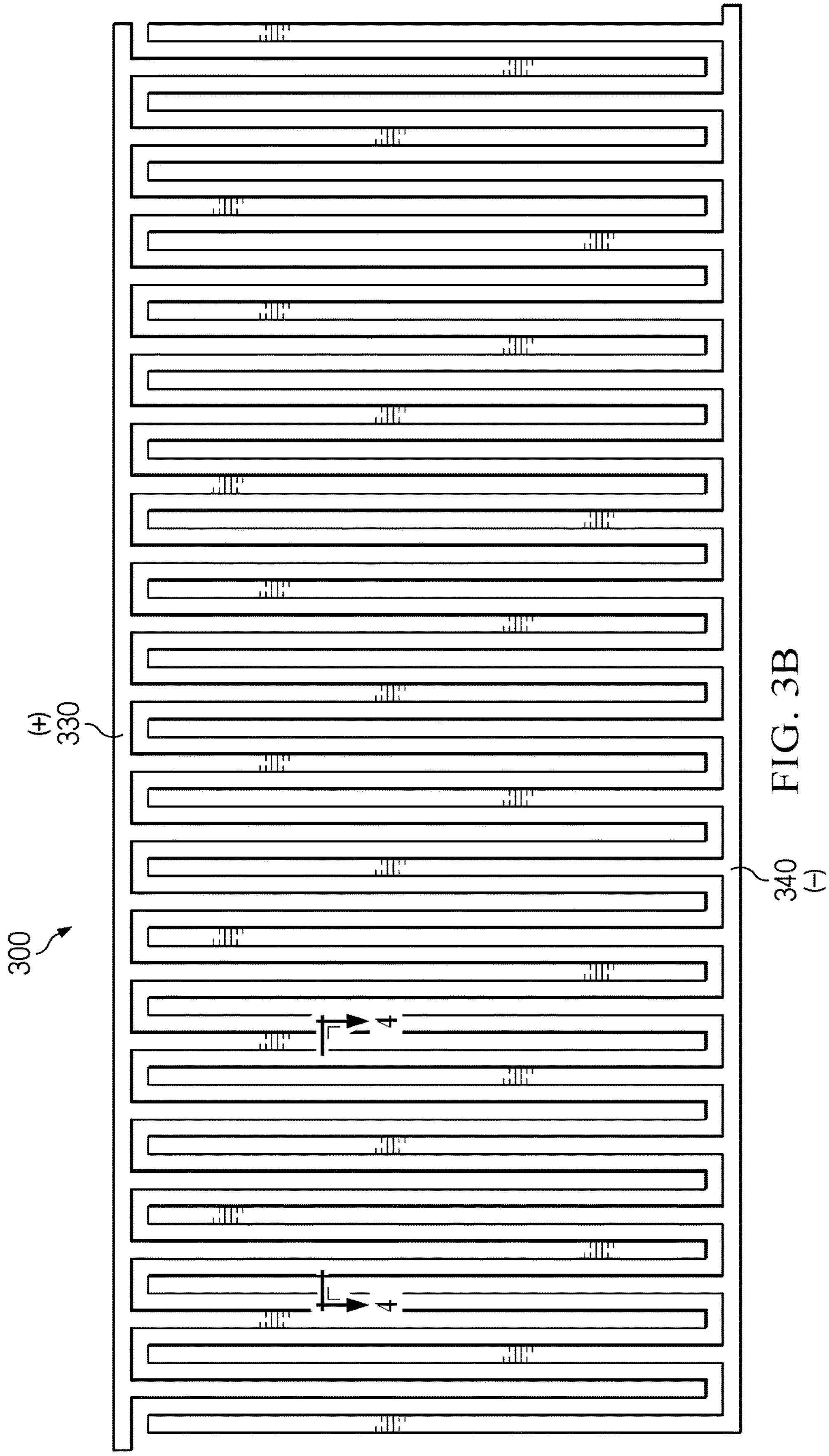

FIGS. 3A and 3B illustrate one example of a capacitor 300 that may be integrated with other components to form an integrated circuit such as the circuit 100. FIG. 3A shows an electrode (or plate) 310 and an electrode (or plate) 320 formed in a first metal level of a multi-level IC interconnect system. FIG. 3A shows an electrode (or plate) 320 and an electrode (or plate) 330 formed in a second metal level of the multi-level IC interconnect system. In the illustrated example the polarities of the electrodes 310 and 330 are positive (+) and the polarities of the electrodes 320 and 340 are negative (−), though in other examples the polarities may be reversed. Each electrode includes a number of fingers projecting from a common bus bar. Fingers of the electrode 310 are interdigitated, or alternate, with fingers of the electrode 320. Similarly, fingers of the electrode 330 are interdigitated with fingers of the electrode 340.

Figure 4:
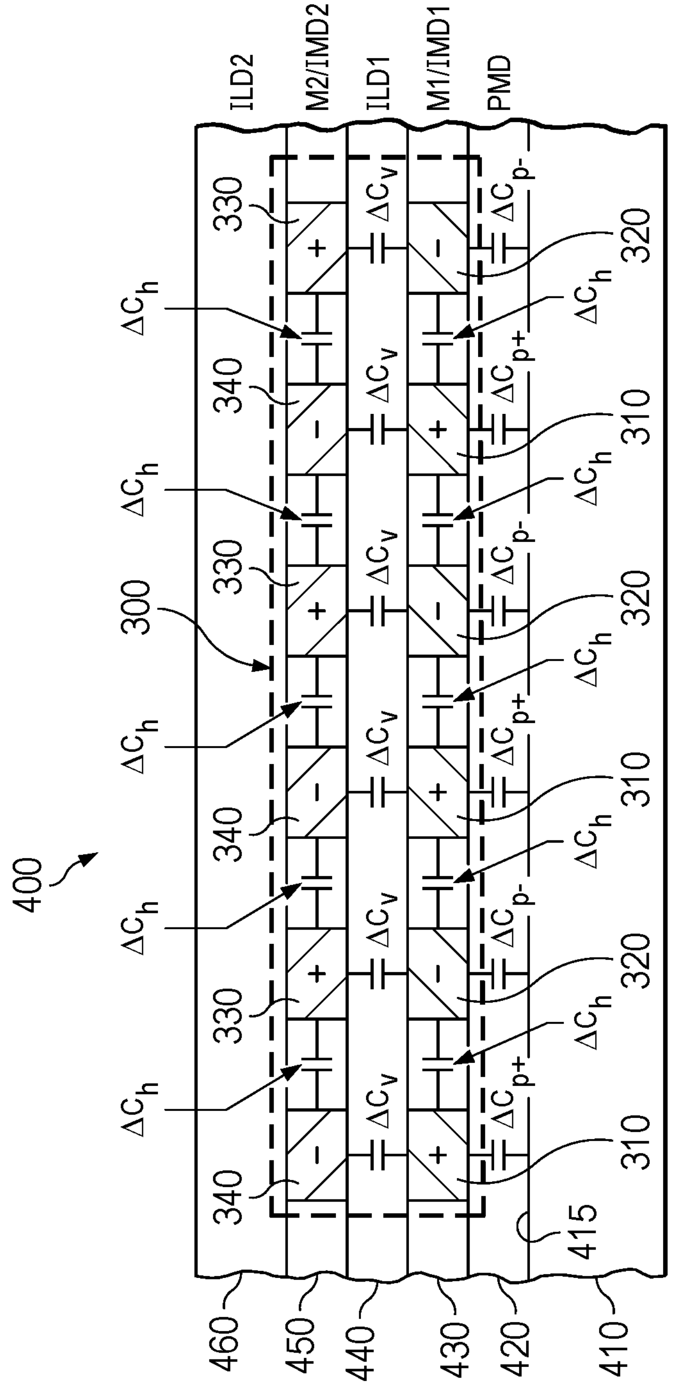
FIG. 4 illustrates a section view of a baseline capacitor that includes electrodes as shown in FIGS. 3A and 3B.

FIG. 4 shows a section view of an IC 400 that implements a capacitor such as the capacitor 300 in a first metal level MET1 and a second metal level MET2 over a semiconductor substrate 410 that has a top surface 415. The electrode 310 and the electrode 320 are located over a pre-metal dielectric (PMD) layer 420, and within an interlevel dielectric (ILD) layer 430. A ILD1 layer 440 vertically separates the electrodes 310, 320 from the electrodes 330, 340, which are located within an IMD2 layer 450. An ILD layer 460 overlies the electrodes 330, 340.

The electrodes are positioned such that the fingers of the electrode 340 are located over the fingers of the electrode 310, and the fingers of the electrode 330 are located over the fingers of the electrode 320. An incremental lateral, or horizontal, capacitance $\Delta C_h$ exists between adjacent fingers of the electrodes 310, 320, and an incremental capacitance $\Delta C_v$ exists between vertically adjacent fingers of the electrodes 310, 340 and of the electrodes 320, 330. An incremental parasitic capacitance $\Delta C_{p+}$ exists between the electrodes 310 and the substrate 410, and an incremental parasitic capacitance $\Delta C_{p-}$ exists between the electrodes 320 and the substrate 410. A total primary capacitance $C_T$ of the capacitor 300 is the sum of incremental capacitances $\Delta C_h$ and $\Delta C_v$. A total parasitic capacitance $C_{p+}$ of the positive terminal of the capacitor 300 (electrodes 310 and 330) is the sum of incremental parasitic capacitances $\Delta C_{p+}$, and a total parasitic capacitance $C_{p-}$ of the negative terminal of the capacitor 300 (electrodes 320 and 340) is the sum of incremental parasitic capacitances $\Delta C_{p-}$.

The value of $C_T$ is determined by factors such as the aggregate relative dielectric permittivity (sometime referred to as dielectric constant) of the dielectric layers used to for the PMD layer 420, IMD1 layer 430, ILD1 layer 440, ILD2 layer 450 and to a relatively minor extent the ILD 2 layer 460, as well as the height and width of the fingers of the electrodes 310 . . . 340 and the lateral spacing between the fingers of the electrodes 310 and 320, the lateral spacing between the fingers of the electrodes 330 and 340, and the vertical thickness of the ILD1 layer 440. The values of $C_{p+}$ and $C_{p-}$ are determined primarily by the thickness of the PMD layer 420 and the width of the fingers of the electrodes 310 and 320. The contribution of $C_{p+}$ and $C_{p-}$ to the operation of a circuit in which the capacitor 300 is connected depends in part on factors such as the electrical potential and resistivity of the substrate 410. For example, if the electrode 320 and the substrate 410 are grounded the contribution of $C_{p-}$ is less than the contribution of $C_{p+}$.

In one baseline example the aggregate dielectric constant of the various dielectric layer is about 3.7-4.0, consistent with primarily silicon oxide with a minor contribution by thin silicon nitride layers used in forming the IC. The height of the MET1 and MET2 layers (electrode 310 . . . 340) is about 0.5 μm, and the lateral spacing between the fingers is about 0.4 μm. The thickness of the PMD layer 420 is about 0.5 μm, as is the thickness of the ILD1 layer 440. In this example the capacitor 300 has a unit capacitance Cu, or capacitance per unit area, of about 0.16 fF/μm$^2$, with parasitic unit capacitances $\Delta C_{up+}$ and $\Delta C_{up-}$ of 0.023 fF/μm$^2$.

Another baseline example has an aggregate dielectric constant of about 3.7-4.0, MET1 and MET2 height of about 0.5 μm, and vertical MET1-MET2 spacing (ILD1 440 thickness) of about 0.5 μm. In this example the lateral spacing between the fingers is about 0.25 μm. The vertical MET1-MET2 spacing between the substrate is about 0.5 μm, as is the spacing between the MET1 and MET2 layer. In this example the capacitor 300 has a unit capacitance value Cu of about 0.47 fF/μm$^2$, with unit parasitic capacitances $\Delta C_{up+}$ and $\Delta C_{up-}$ of 0.034 fF/μm$^2$.

One advantage of the second example with respect to the first example is that with the greater unit capacitance, a capacitor of a given value may be made smaller. For example a 150 fF capacitor in the first example requires about 950 μm$^2$, while a 150 fF capacitor in the second example only requires about 320 μm$^2$. Thus, while the unit parasitic capacitance of the second example is greater than in the first example, the total parasitic capacitances $C_{p+}$ and $C_{p-}$ equal about 11 fF in the second example, and about 22 fF in the first example. While the parasitic capacitance for the 150 fF capacitor in the second example is half that of the first example, it is about 7.3% of the direct capacitance. This parasitic value is large enough to significantly degrade the performance of a circuit such the example circuit 100 of FIG. 1.

Figure 5A:
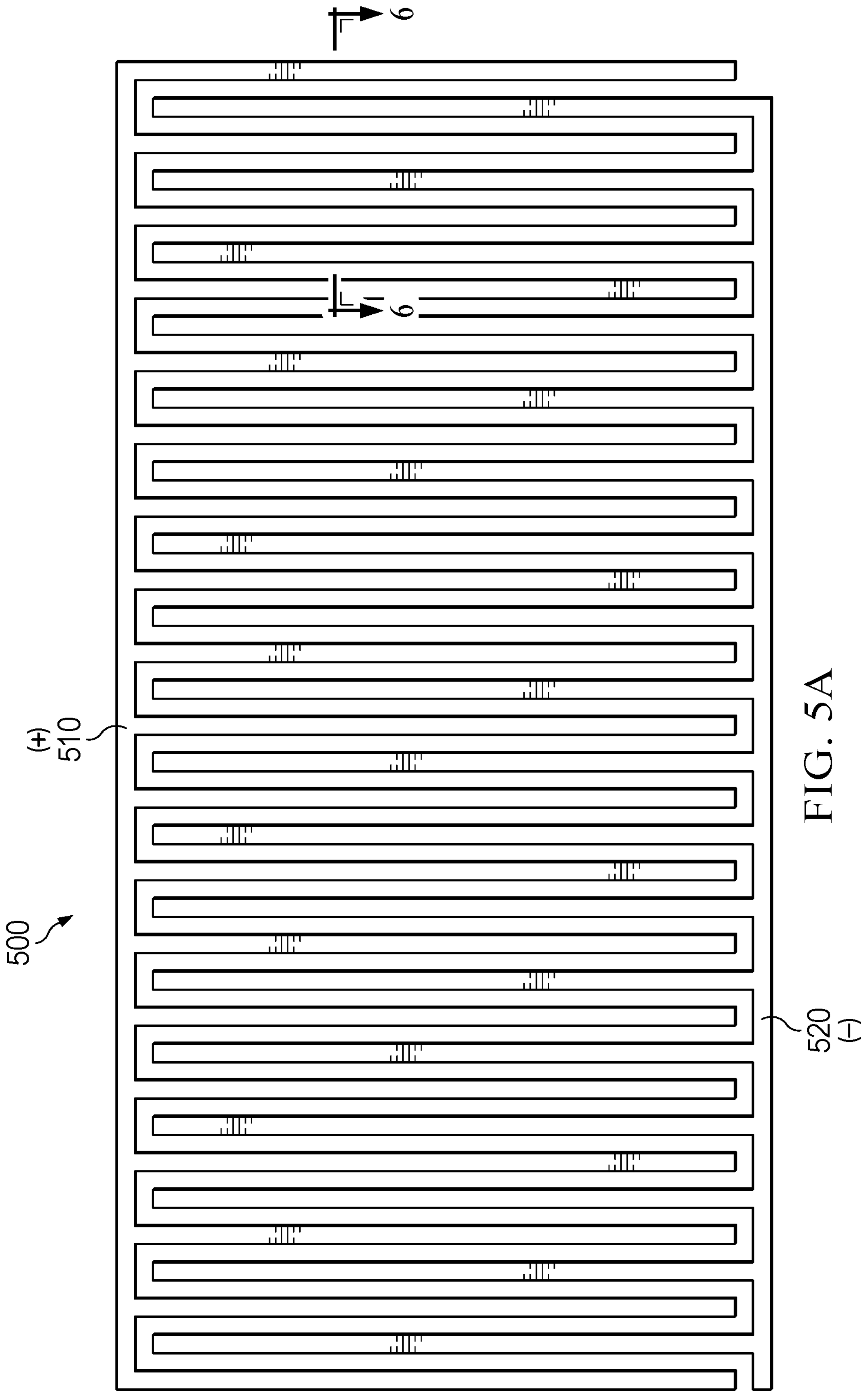
FIGS. 5A and 5B respectively illustrate first and second capacitor electrodes in a first metal level, and third and fourth capacitor electrodes in a second metal level, as used in some example MIM capacitors of the disclosure.
Figure 5B:
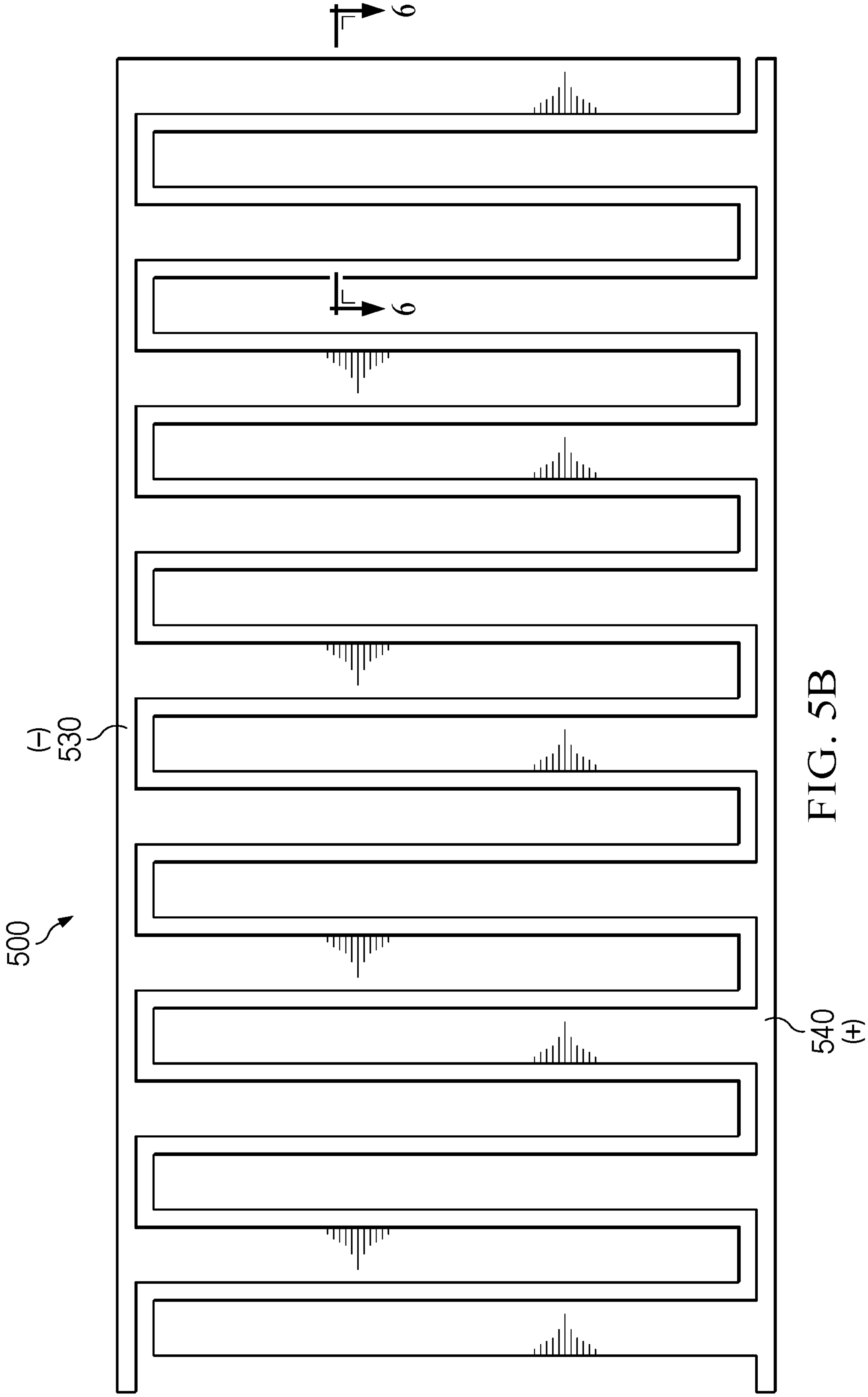
Figure 6:
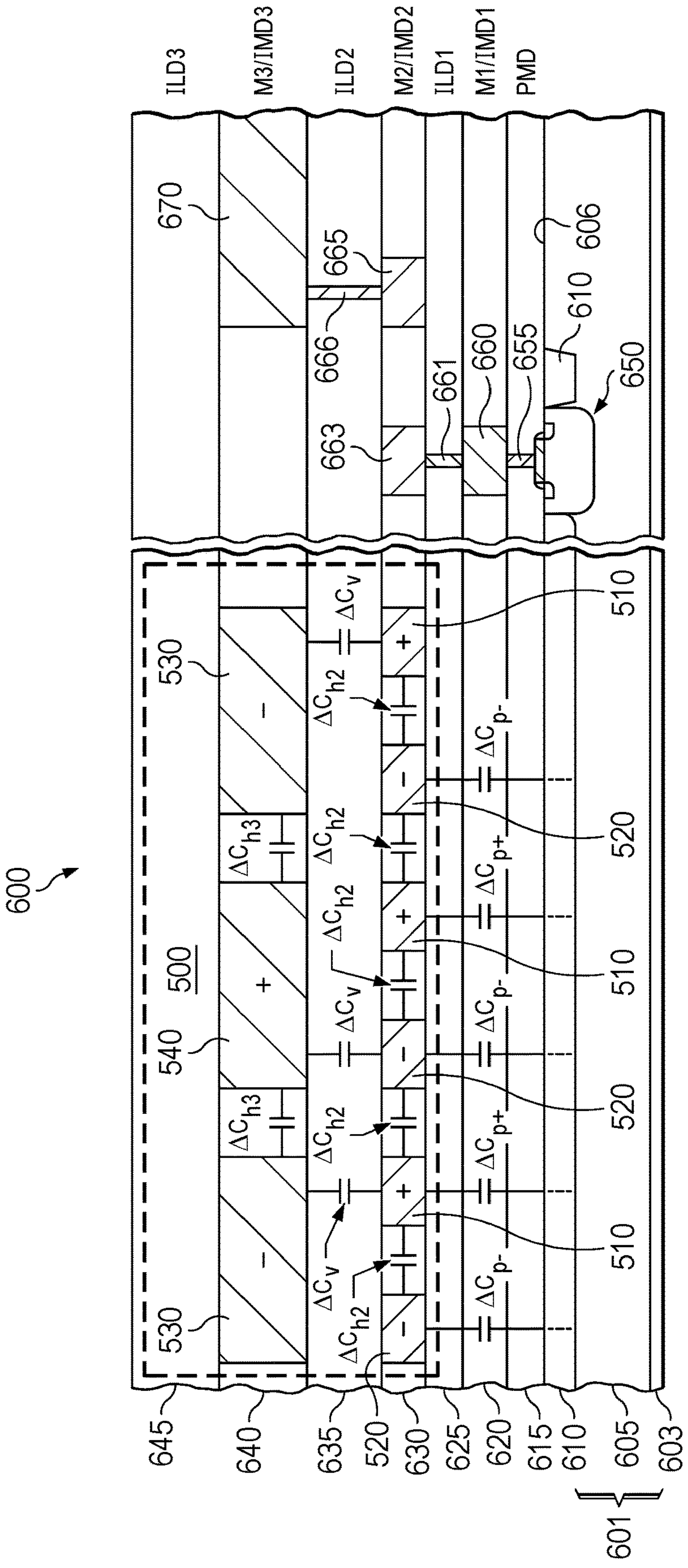
FIG. 6 illustrates a section view of an example MIM capacitor of the disclosure, in which the first and second capacitor electrodes of FIG. 5A are implemented in a MET2 level of an IC, and the third and fourth electrodes of FIG. 5B are implemented in a MET3 level of the IC.

FIGS. 5A and 5B and FIG. 6 illustrate aspects of examples of the disclosure that advantageously provide a unit capacitance similar to that of the second example of the capacitor 300, while significantly reducing the parasitic capacitance. Referring first to FIGS. 5A and 5B, a capacitor 500 includes two electrodes 510, 540 that operate as one terminal or plate, and two electrodes 520, 530 that operate as another terminal or plate. For convenience, the terminal including the electrodes 510, 540 is designated "+" and the terminal including the electrodes 520, 530 is designated "−", but the terminals may be operated with any electrical polarity.

FIG. 6 shows a section view of an IC 600 that implements a capacitor such as the capacitor 500 in a first metal level MET2 and a second metal level MET3 over a semiconductor substrate 601. The substrate 601 includes a bulk substrate 603 (such as a handle wafer) and an epitaxial layer 605 in the current example, though the epitaxial layer 605 may be omitted in other examples. The substrate 603 has a top surface 606, which is the top surface of the epitaxial layer if present. A shallow trench isolation (STI) layer 610 is located within the epitaxial layer 605, but may be omitted in some other examples. In other examples a local oxidation of silicon (LOCOS) layer may be used instead of an STI layer.

The IC 600 includes at least three metal levels and associated dielectric levels. Accordingly, a PMD layer 615 is located over the substrate 601 and epitaxial layer 605 if present. Above the PMD layer 615 are IMD1 layer 620, ILD1 layer 625, IMD2 layer 630, ILD2 layer 635, IMD3 layer 640 and ILD3 layer 645. In examples that only include three metal levels the ILD3 layer 645 may be or include a portion of a passivation overcoat (PO) stack. Metal structures within the IMD1 layer 620 are MET1 structures, metal structures within the IMD2 layer 630 are MET2 structures, and metal structures within the IMD3 layer 640 are MET3 structures.

The capacitor 500 is implemented in the MET2 and MET3 levels in the illustrated example, such that the electrodes 510, 520 are located in the MET2 level and the electrodes 530, 540 are located in the MET3 level. Each finger of the electrode 530 is located at least partially over one finger of the electrode 510 and at least partially over one finger of the electrode 520. Similarly each finger of electrode 540 is located at least partially over one finger of the electrode 510 and at least partially over one finger of the electrode 520. Because the electrodes 520 and 530 are operated at a same potential there is no effective capacitance between these electrodes. Similarly, the electrodes 510 and 540 are operated at a same potential so there is no effective capacitance between these electrodes. An incremental horizontal capacitance $\Delta C_{h2}$ occurs between adjacent fingers in the MET2 level, and an incremental horizontal capacitance $\Delta C_{h3}$ occurs between adjacent fingers in the MET3 level. An incremental vertical capacitance $\Delta C_v$ occurs between each MET3 finger and an underlying MET2 finger of the opposite polarity. The total capacitance of the capacitor 500 includes the contribution of the within-level incremental capacitances $\Delta C_{h2}$ and $\Delta C_{h3}$, and the contribution of the between-level incremental capacitances $\Delta C_v$.

In various examples the thickness of the MET3 layer is greater than the thickness of the MET2 layer. In the illustrated example, MET3 is twice as thick as MET2, but the thickness difference is not limited to any particular value. In various examples and as illustrated the spacing between fingers in the MET3 level is the same as the spacing between fingers in the MET2 level, but in other examples the spacing may be different. In various examples and as illustrated the pitch of the fingers at the MET3 level is equal to twice the pitch of the fingers at the MET2 level. In such examples, the pitch of the MET3 fingers is equal to the width of a single MET3 finger plus the space between adjacent MET3 fingers, and this pitch is equal to two times the width of a single MET2 finger plus two times the space between adjacent MET2 fingers. In various examples and as illustrated lateral extents (e.g. "sidewalls") of the MET3 fingers vertically align with lateral extents of the MET2 fingers, though this is not a requirement.

MET2 fingers of the electrodes 510, 520 experience a respective parasitic capacitive coupling $\Delta C_{p+}$ and $\Delta C_{p-}$ to the substrate 601, or the epitaxial layer 605 if present. In examples that include the STI layer 610 the parasitic capacitive coupling is through this layer. The distance between the MET2 fingers and the substrate 601 (or epitaxial layer 605) includes the thicknesses of the PMD layer 615, the MET1 layer 620 and the ILD1 layer 625, as well as the thickness of the STI layer 610 if present. As compared to the capacitor 300 (FIG. 4), the distance between the top surface 606 and the lower metal level of the capacitor 500 (MET2) is greater than the distance between the top surface 415 and the lower metal level of the capacitor 300 (MET1). Also, as compared to the capacitor 300, the thickness of the top electrodes 530, 540 is greater than the thickness up the top electrodes 330, 340.

The greater distance between the electrodes 510, 520 and the substrate 601 reduces $\Delta C_{p+}$ and $\Delta C_{p-}$ for the capacitor 500 relative to the capacitor 300, thereby reducing the unit parasitic capacitance of the capacitor 500 relative to the capacitor 300. The greater height of the electrodes 530, 540 relative to the electrodes 330, 340 increases $\Delta C_{h3}$ relative to $\Delta C_h$, offsetting the loss of horizontal capacitance that results from the fewer number of fingers in the top electrodes 530, 540 relative to the top electrodes 330, 340 and the lower vertical capacitance between the metal levels in the capacitor 500.

In an example, the PMD layer 615, IMD1 layer 620, ILD1 layer 625 and IMD1 layer 630 (and thus MET2) each have a thickness of about 0.5 μm, and the ILD2 layer 635 layer and IMD3 layer 640 (and thus MET3) each have a thickness of about 1.0 μm, and the IMD and ILD levels have a dielectric constant of 3.7-4.0. The STI layer 610, if present, has a dielectric constant of about 3.7 and a thickness of about 200 nm to about 400 nm. The fingers of the electrodes 510 and 520 have a width of about 0.25 μm, and are spaced apart by about 0.25 μm. The fingers of the electrodes 530, 540 have a width of about 0.75 μm and are spaced apart by about 0.25 μm.

In this example the capacitor 500 has a unit capacitance value Cu of about 0.45 fF/μm$^2$, with unit parasitic capacitances $C_{up+}$ of 0.029 fF/μm$^2$ and $C_{up-}$ of 0.017 fF/μm$^2$. In a further example, a 150 fF capacitor according to the example of FIG. 6 would require about 333 μm$^2$ and would have a parasitic capacitance $C_{p+}$ of 9.1 fF and $C_{p+}$ of 5.8 fF. As compared to the second example above of the capacitor 300 with 0.25 μm line spacing, the reduction of $C_{p+}$ is about 50% and the reduction of $C_{p-}$ is about 12%, while the increase of size of the capacitor is only about 3%. Thus examples if the disclosure may provide a significant reduction of parasitic capacitance for a given capacitance value with negligible increase of capacitor size.

In the illustrated example of the IC 600, one terminal of the capacitor 500 is connected to the gate of a transistor 650 by a vertical interconnect (via) 661, a trace 660 at the MET1 level, and a vertical interconnect (contact) 655 to a trace 663 at the MET2 level. The trace 663 is connected to the capacitor terminal by an interconnection outside the view of the figure. In some other examples the via 661 may be directly connected to a bus bar of one of the electrodes of the capacitor 500 or to one of the fingers of the electrodes. The source or drain of the transistor is connected by interconnections outside the view of the figure to a trace 665 at the MET2 level, and by another via 666 to a trace 670 at the MET3 level, as one example of signal routing that may be used to realize a capacitor such as, e.g. one of the capacitors C1 . . . C4.

The IC 600 may be formed by any known or future-developed manufacturing technology. In some examples the metal features are formed by subtractive aluminum etch or by copper damascene. (Metal lines formed by subtractive aluminum etch are typically substantially aluminum with small amounts of alloying elements. Metal lines formed by copper damascene are typically substantially copper with small amounts of alloying elements.) Various dielectric layers, diffusion barriers and stopping layers may be included as appropriate to the technology used. The dielectric layers may be formed by plasma deposition processes, and may have any dielectric constant consistent with the processing technology. The capacitor 500 may connect to any other circuit component, such as a resistor, an inductor, another capacitor, a MOS transistor or a bipolar transistor. While examples of the disclosure may be particularly suited to radio-frequency applications, such examples may be used in any circuit application in which a capacitor is used.

Figure 7:
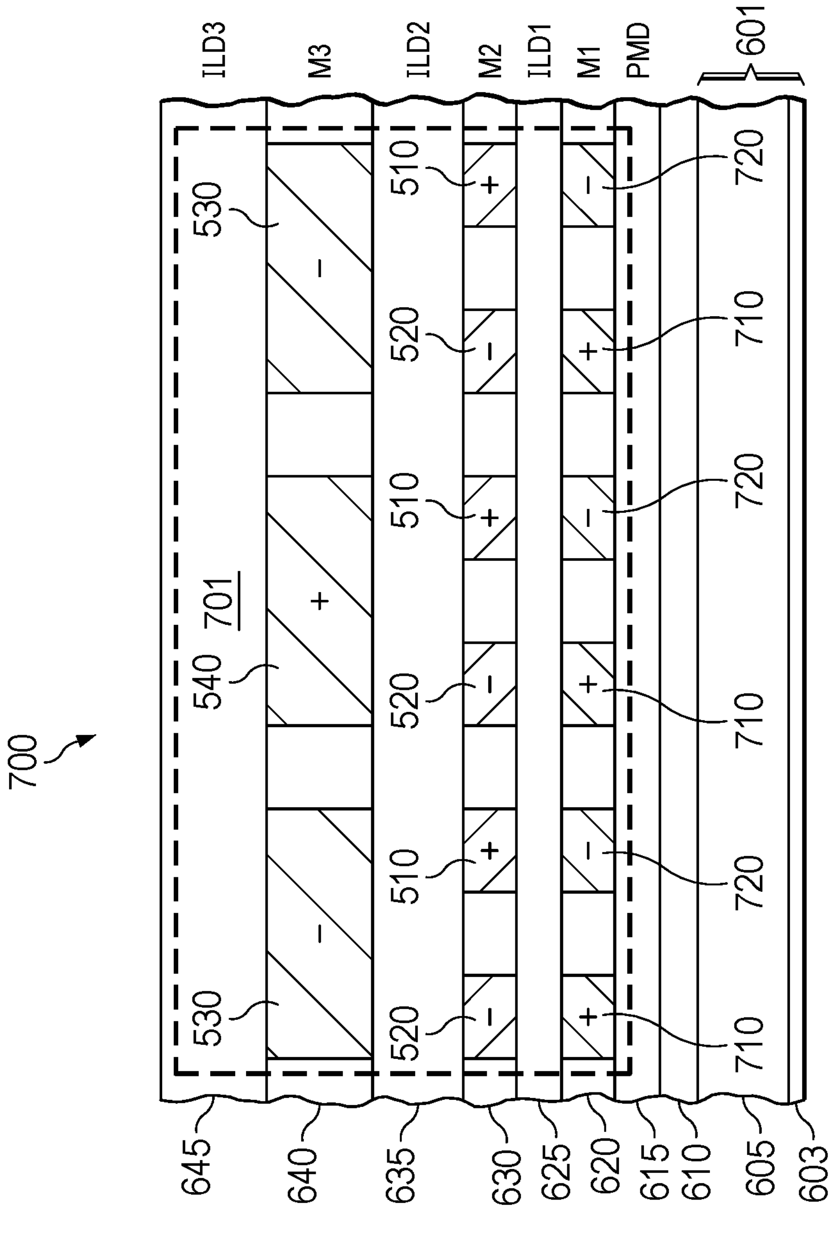
FIG. 7 illustrates a section view of another example MIM capacitor of the disclosure, in which fifth and sixth electrodes are implemented at a third metal level, e.g. MET1.

FIG. 7 shows another example of an integrated circuit 700 in which like indexes are as described with respect to FIG. 6. The integrated circuit 700 includes a capacitor 701 that includes electrodes at three metal levels, e.g. MET1, MET2 and MET3. The capacitor 701 includes electrodes at the MET2 level exemplified by the electrodes 510, 520 previously described, and electrodes at MET3 exemplified by the electrodes 530, 540 previously described. In addition, the capacitor 701 includes electrodes 710, 720 at the MET1 level. The electrodes 510, 540 and 710 are connected to a first, e.g. positive, terminal of the capacitor 701, and the electrodes 520, 530 and 720 are connected to a second, e.g. negative, terminal of the capacitor 701. The electrodes 710, 720 have a layout that matches the electrodes 510, 530 such that a finger of the electrode 510 overlies a finger of the electrode 720, and a finger of the electrode 520 overlies finger of the electrode 710. While the electrodes 710 and 720 are expected to increase the unit parasitic capacitance of the terminals of the capacitor 701 relative to the capacitor 500, the added primary capacitance allows the capacitor 701 to implement a capacitance of a desired value in a smaller area than the capacitor 600. Furthermore, relative to the capacitor 300 having the same linewidth and spacing, the additional unit capacitance of the capacitor 701 provides an additional degree of freedom in designing a high-frequency circuit with desired capacitance and parasitic characteristics.

Figure 8:
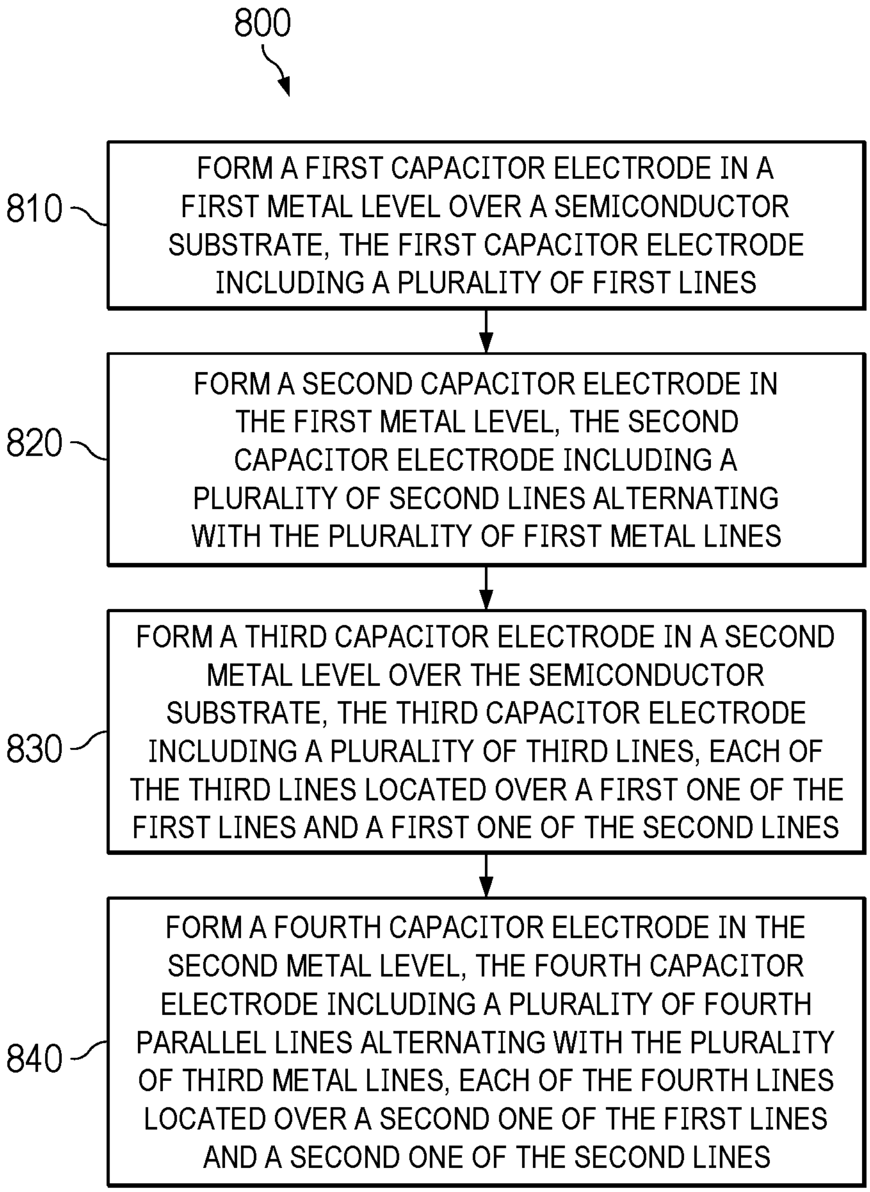
FIG. 8 provides a method of forming an integrated circuit according to various examples.

Turning to FIG. 8, a method 800 of forming an integrated circuit is shown. In a step 810 a first capacitor electrode is formed in a first metal level over a semiconductor substrate, the first capacitor electrode including a plurality of first lines. The first capacitor electrode may be exemplified by the electrode 510 in FIGS. 5A and 6. In a step 820, a second capacitor electrode is formed in the first metal level, the second capacitor electrode including a plurality of second lines alternating with the plurality of first metal lines. The second capacitor electrode may be exemplified by the electrode 520 in FIGS. 5A and 6. In a step 830, a third capacitor electrode is formed in a second metal level over the semiconductor substrate, the third capacitor electrode including a plurality of third lines, each of the third lines located over a first one of the first lines and a first one of the second lines. The third capacitor electrode may be exemplified by the electrode 530 in FIGS. 5B and 6. And in step 840, a fourth capacitor electrode is formed in the second metal level, the fourth capacitor electrode including a plurality of fourth parallel lines alternating with the plurality of third metal lines, each of the fourth lines located over a second one of the first lines and a second one of the second lines. The fourth capacitor electrode may be exemplified by the electrode 540 in FIGS. 5B and 6.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated circuit, comprising:

first and second metal levels over a semiconductor substrate;

a first capacitor electrode in the first metal level, the first capacitor electrode including a plurality of first metal lines;

a second capacitor electrode in the first metal level, the second capacitor electrode including a plurality of second metal lines alternating with the plurality of first metal lines;

a third capacitor electrode in the second metal level, the third capacitor electrode including a plurality of third metal lines, each of the third metal lines located over a respective one of the first metal lines and a respective one of the second metal lines; and a fourth capacitor electrode in the second metal level, the fourth capacitor electrode including a plurality of fourth metal lines alternating with the plurality of third metal lines, each of the fourth metal lines located over a respective one of the first metal lines and a respective one of the second metal lines.

2. The integrated circuit of claim 1, wherein the third metal lines and the fourth metal lines have a first thickness twice a second thickness of the first metal lines and the second metal lines.

3. The integrated circuit of claim 1, wherein the first metal lines, second metal lines, third metal lines and fourth metal lines are substantially aluminum.

4. The integrated circuit of claim 1, wherein the first metal lines have a first width and the second metal lines have a second width, the first and second metal lines are spaced apart by a first space, and the third metal lines have a width equal to the sum of the first and second widths and the first space.

5. The integrated circuit of claim 4, wherein the fourth metal lines have a width equal to the sum of the first and second widths and the first space.

6. The integrated circuit of claim 1, wherein the first electrode and the third electrode are connected to a first capacitor terminal, and the second electrode and the fourth electrode are connected to a second capacitor terminal.

7. The integrated circuit of claim 1, wherein the first, second, third and fourth capacitor electrodes are components of a capacitor connected in a radio-frequency circuit.

8. The integrated circuit of claim 1, further comprising a transistor extending into the semiconductor substrate, a terminal of the transistor connected to one of the first, second, third or fourth capacitor electrodes.

9. The integrated circuit of claim 1, wherein a thickness of the second metal level is greater than a thickness of the first metal level.

10. The integrated circuit of claim 1, wherein the first and second electrodes have a thickness of 0.5 μm and the third and fourth electrodes have a thickness of 1.0 μm, further comprising a transistor extending into the semiconductor substrate, a terminal of the transistor connected to one of the first, second, third or fourth capacitor electrodes.

11. The integrated circuit of claim 1, wherein the first and second electrodes are spaced apart by about 250 nm and the third and fourth electrodes are spaced apart by about 250 nm.

12. The integrated circuit of claim 1, wherein the first, second, third and fourth capacitor electrodes are components of a capacitor having a unit capacitance of about 0.45 $fF/\mu m^2$ and a parasitic capacitance of about 0.029 $fF/\mu m^2$.

13. A method of making an integrated circuit, comprising:

forming a first capacitor electrode in a first metal level over a semiconductor substrate, the first capacitor electrode including a plurality of first metal lines;

forming a second capacitor electrode in the first metal level, the second capacitor electrode including a plurality of second metal lines alternating with the plurality of first metal lines;

forming a third capacitor electrode in a second metal level over the semiconductor substrate, the third capacitor electrode including a plurality of third metal lines, each of the third metal lines located over a respective one of the first lines and a respective one of the second metal lines; and forming a fourth capacitor electrode in the second metal level, the fourth capacitor electrode including a plurality of fourth metal lines alternating with the plurality of third metal lines, each of the fourth metal lines located over a respective one of the first metal lines and a respective one of the second metal lines.

14. The method of claim 13, wherein the third metal lines and the fourth metal lines have a first thickness about twice a second thickness of the first metal lines and the second metal lines.

15. The method of claim 13, wherein the first metal lines, second metal lines, third metal lines and fourth metal lines are substantially aluminum.

16. The method of claim 13, wherein the first metal lines have a first width and the second metal lines have a second width, the first and second metal lines are spaced apart by a first space, and the third metal lines have a width about equal to the sum of the first and second widths and the first space.

17. The method of claim 13, wherein the first electrode and the third electrode are connected to a first capacitor terminal and the second electrode and the fourth electrode are connected to a second capacitor terminal.

18. The method of claim 13, further comprising forming a transistor extending into the semiconductor substrate, a terminal of the transistor connected to one of the first, second, third or fourth capacitor electrodes.

19. The method of claim 13, wherein the first metal level is a MET2 level, and the second metal level is a MET3 level.

20. The method of claim 13, wherein the first and second electrodes have a thickness of about 0.5 μm and the third and fourth electrodes have a thickness of about 1.0 μm, further comprising a transistor extending into the semiconductor substrate, a terminal of the transistor connected to one of the first, second, third or fourth capacitor electrodes.

21. The method of claim 13, wherein the first and second electrodes are spaced apart by about 250 nm and the third and fourth electrodes are spaced apart by about 250 nm.

22. The method of claim 13, wherein the first, second, third and fourth capacitor electrodes are components of a capacitor having a unit capacitance of about 0.45 $fF/\mu m^2$ and a parasitic capacitance of about 0.045 $fF/\mu m^2$.

23. An electronic device, comprising:

a first metal level and a second metal level over a semiconductor substrate;

a first electrode in the first metal level, the first electrode including a plurality of first metal lines;

a second electrode in the first metal level, the second electrode including a plurality of second metal lines interleaved with the plurality of first metal lines;

a third electrode in the second metal level, the third electrode including a plurality of third metal lines, each of the third metal lines located over a respective one of the first metal lines and a respective one of the second metal lines; and a fourth electrode in the second metal level, the fourth electrode including a plurality of fourth metal lines alternating with the plurality of third metal lines, each of the fourth metal lines located over a respective one of the first metal lines and a respective one of the second metal lines.

24. The electronic device of claim 23, wherein the third metal lines and the fourth metal lines have a first thickness twice a second thickness of the first metal lines and the second metal lines.

* * * * *